(12) United States Patent
Kwon et al.

(10) Patent No.: US 11,313,956 B2
(45) Date of Patent: Apr. 26, 2022

(54) PHOTODETECTOR, LIDAR, AND METHOD OF MANUFACTUARING PHOTODETECTOR

(71) Applicants: Kabushiki Kaisha Toshiba, Minato-ku (JP); Toshiba Electronic Devices & Storage Corporation, Minato-ku (JP)

(72) Inventors: Honam Kwon, Kawasaki (JP); Ikuo Fujiwara, Yokohama (JP); Kazuhiro Suzuki, Meguro (JP); Keita Sasaki, Yokohama (JP); Yuki Nobusa, Yokohama (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 739 days.

(21) Appl. No.: 16/129,205

(22) Filed: Sep. 12, 2018

(65) Prior Publication Data

US 2019/0293767 A1     Sep. 26, 2019

(30) Foreign Application Priority Data

Mar. 22, 2018   (JP) .............................. JP2018-054814

(51) Int. Cl.
*G01S 7/4863*     (2020.01)
*G01S 17/10*      (2020.01)
(Continued)

(52) U.S. Cl.
CPC ............ *G01S 7/4863* (2013.01); *G01S 17/08* (2013.01); *G01S 17/10* (2013.01);
(Continued)

(58) Field of Classification Search
CPC ........ G01S 17/42; G01S 17/10; G01S 7/4817; G01S 7/4863; H01L 27/1446; H01L 31/02027; H01L 31/10
See application file for complete search history.

(56) References Cited

U.S. PATENT DOCUMENTS 8,008,741 B2   8/2011   Yamamura et al.
8,610,231 B2   12/2013  Yamamura et al.
(Continued)

FOREIGN PATENT DOCUMENTS

CN    106441597 A    2/2017
EP    3 182 154 A1   6/2017
(Continued)

OTHER PUBLICATIONS

Extended European Search Report dated Mar. 27, 2019 in European Patent Application No. 18193685.7, 9 pages.

*Primary Examiner* — Luke D Ratcliffe
(74) *Attorney, Agent, or Firm* — Oblon, McClelland, Maier & Neustadt, L.L.P.

(57) ABSTRACT

A photodetector includes a plurality of first light detection elements having a first driving voltage range, the first light detection elements including first semiconductor layers having a first conductivity type and second semiconductor layers having a second conductivity type different from the first conductivity type; and a second light detection element having a second driving voltage range different from the first driving voltage range, the second light detection element including a third semiconductor layer having the first conductivity type and a fourth semiconductor layer having the second conductivity type.

7 Claims, 6 Drawing Sheets

(51) Int. Cl.
*H01L 27/144* (2006.01)
*G01S 17/08* (2006.01)
*H01L 31/02* (2006.01)
*H01L 31/107* (2006.01)

(52) U.S. Cl.
CPC .... *H01L 27/1446* (2013.01); *H01L 31/02027* (2013.01); *H01L 31/107* (2013.01)

(56) References Cited

U.S. PATENT DOCUMENTS

| | | | |
|---|---|---|---|
| 8,803,263 | B2 | 8/2014 | Yamada et al. |
| 9,075,152 | B2 | 7/2015 | Totsuka |
| 9,159,765 | B2 | 10/2015 | Totsuka |
| 9,484,366 | B2 | 11/2016 | Yamamura et al. |
| 2002/0195545 | A1 | 12/2002 | Nishimura et al. |
| 2009/0256223 | A1 | 10/2009 | Yamamura et al. |
| 2011/0227183 | A1 | 9/2011 | Yamamura et al. |
| 2013/0119501 | A1 | 5/2013 | Yoshida |
| 2013/0187251 | A1 | 7/2013 | Yamamura et al. |
| 2016/0086989 | A1 | 3/2016 | Yamamoto et al. |
| 2017/0033137 | A1 | 2/2017 | Yamamura et al. |
| 2017/0176579 | A1* | 6/2017 | Niclass .................. G01S 17/42 |
| 2017/0179173 | A1* | 6/2017 | Mandai ............. H01L 27/14643 |

FOREIGN PATENT DOCUMENTS

| | | |
|---|---|---|
| JP | 5-37000 | 2/1993 |
| JP | 9-210771 | 8/1997 |
| JP | 2013-36814 | 2/2013 |
| JP | 2013-38174 | 2/2013 |
| JP | 5183471 | 4/2013 |
| JP | 5450295 | 3/2014 |
| WO | WO 2010/073137 A1 | 7/2010 |

* cited by examiner

PHOTODETECTOR, LIDAR, AND METHOD OF MANUFACTUARING PHOTODETECTOR

CROSS-REFERENCE TO RELATED APPLICATIONS

This application is based upon and claims the benefit of priority from the prior Japanese Patent Application No. 2018-054814, filed on Mar. 22, 2018, the entire contents of which are incorporated herein by reference

TECHNICAL FIELD

Embodiments relate to a photodetector, a Lidar and a method of manufacturing photodetector.

BACKGROUND

A laser imaging detection and ranging (LIDAR) device is a distance image sensing system adopting a time-of-flight (TOF) distance measuring method of measuring a time when the laser light reciprocates to a target and converting the time into a distance, and the LIDAR device is applied to an in-vehicle drive-assist system, remote sensing, and the like.

A photodetector used in the LIDAR device includes one or more light detection elements. The light detection element is applied with a driving voltage for driving the light detection element to detect light. In a general light detection element, since ion implantation conditions are uniform, the driving voltage range is almost the same in all elements.

SUMMARY

Embodiments of the invention provide a photodetector having different driving voltage ranges and improved device characteristics.

A photodetector includes a plurality of first light detection elements having a first driving voltage range, the first light detection elements including first semiconductor layers having a first conductivity type and second semiconductor layers having a second conductivity type different from the first conductivity type; and a second light detection element having a second driving voltage range different from the first driving voltage range, the second light detection element including a third semiconductor layer having the first conductivity type and a fourth semiconductor layer having the second conductivity type.

DETAILED DESCRIPTION

Figure 1:
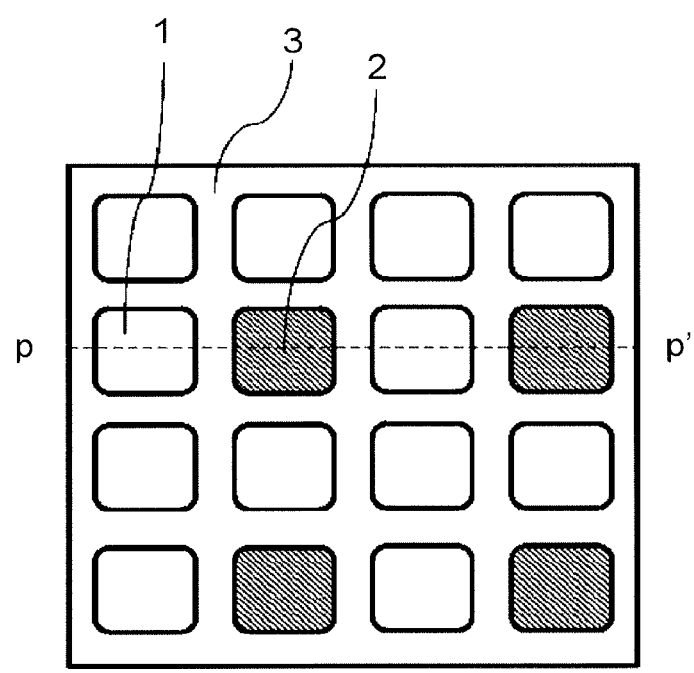
FIG. 1 is a diagram illustrating a photodetector according to a first embodiment as viewed from a light incident side.

Embodiments of the invention will be described below with reference to the drawings. The components denoted by the same reference numerals indicate corresponding components. In addition, the drawings are schematic or conceptual, and a relationship between a thickness and a width of each portion, a ratio of sizes between portions, and the like are not necessarily the same as actual ones. In addition, even in the case of indicate the same portions, sizes and ratios of the portions may be different from each other according to the drawings.

First Embodiment

FIG. 1 is a diagram illustrating a photodetector according to a first embodiment as viewed from a light incident side. This photodetector includes two types of light detection elements having different driving voltage ranges. The driving voltage range is a range of a voltage in which photoelectric conversion can be performed when light is incident on the light detection element.

In FIG. 1, the photodetector includes a plurality of first light detection elements 1, at least one or more second light detection elements 2 provided between the first light detection elements 1, and a non-light detection region 3 provided between the first light detection elements 1 and between the first light detection element 1 and the second light detection element 2. In addition, the second light detection elements 2 are arranged not to be adjacent to each other, and thus, in this embodiment, the light detection elements are arranged so that the ratio of the number of the first light detection elements 1 and the number of the second light detection elements 2 is 3:1. In addition, the driving voltage range of the first light detection element 1 is set to be wider than the driving voltage range of the second light detection element 2.

The first light detection element 1 and the second light detection element 2 detect light (for example, near infrared light) by converting the light into an electric signal. An avalanche photodiode (APD) may be exemplified. In addition, in this embodiment, the first light detection element 1 and the second light detection element 2 have substantially the same opening area. The "substantially same" in this embodiment also includes an error of ±5%. The opening area is an area of the light detection element surrounded by the non-light detection region 3 as viewed from the light incident side. The near infrared light denotes light in a wavelength range of, for example, 780 nm or more and 2500 nm or less.

The non-light detection region 3 is a region where incident light cannot be detected. The non-light detection region 3 is also a region where electrodes are present because the electric signals converted by the light detection elements 1 and 2 are respectively wired to a driving/reading unit to be described later.

Figure 2A:
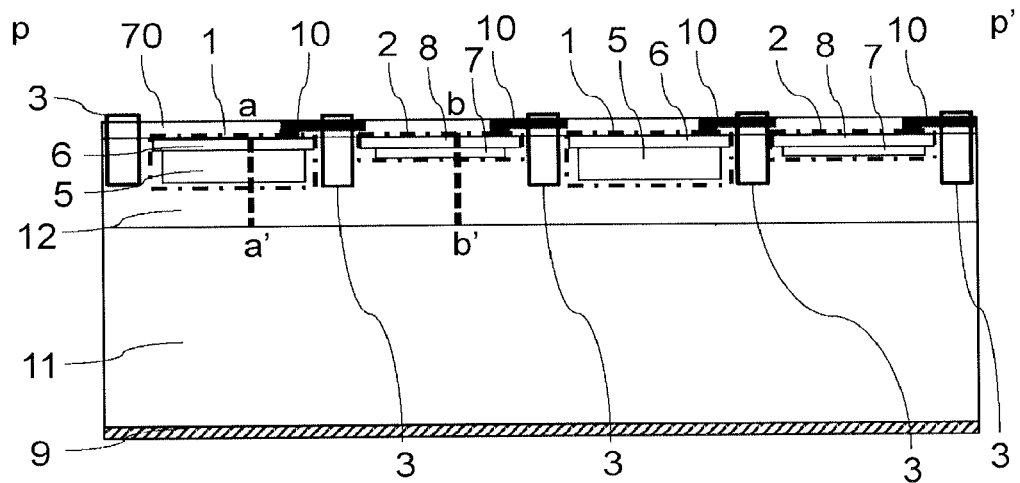
FIG. 2A is a diagram illustrating a p-p' cross section of the photodetector illustrated in FIG. 1.

FIG. 2A is a diagram illustrating a p-p' cross section of the photodetector illustrated in FIG. 1.

In FIG. 2A, the photodetector includes a backside electrode 9, a high-concentration p-type substrate 11 provided on the backside electrode 9, and a p-type semiconductor layer 12 provided on the high-concentration p-type substrate 11. Herein, "on" is the side on which light is incident. The light incident side is the upper side in FIG. 2A.

The first light detection elements 1 and the second light detection elements 2 are alternately provided on the upper surface of the p-type semiconductor layer 12, and an electrode 10 electrically connected to end portions of the upper surfaces of the first light detection element 1 and the second light detection element 2 and a protective layer 70 provided so as to cover the electrode 10 are provided. Herein, the electrode 10 is also arranged in the non-light detection region 3 in FIG. 1.

For example, the first light detection element 1 includes a $p^+$-type semiconductor layer 5 (corresponding to a first semiconductor layer) and an $n^+$-type semiconductor layer (corresponding to a second semiconductor layer) provided on the light incident side of the $p^+$-type semiconductor layer 5, and the interface between the $p^+$-type semiconductor layer 5 and the $n^+$-type semiconductor layer 6 forms a pn junction. In the direction crossing the stacking direction, the width of the $n^+$-type semiconductor layer 6 is larger than the width of the $p^+$-type semiconductor layer 5. Herein, the term "crossing" denotes nearly perpendicular in this embodiment. The electrode 10 is electrically connected to an end portion of the upper surface of the $n^+$-type semiconductor layer 6 of the first light detection element 1.

For example, the second light detection element 2 includes a $p^+$-type semiconductor layer 7 (corresponding to a third semiconductor layer) and an $n^+$-type semiconductor layer (corresponding to a fourth semiconductor layer) provided on the light incident side of the $p^+$-type semiconductor layer 7, and the interface between the $p^+$-type semiconductor layer 7 and the $n^+$-type semiconductor layer 8 forms a pn junction. In the direction crossing the stacking direction, the width of the $n^+$-type semiconductor layer 8 is larger than the width of the $p^+$-type semiconductor layer 7. The electrode 10 is electrically connected to an end portion of the upper surface of the $n^+$-type semiconductor layer 8 of the second light detection element 2.

The difference between the first light detection element 1 and the second light detection element 2 is that the thickness d1 of the $p^+$-type semiconductor layer 5 in the stacking direction is larger than the thickness d2 of the $p^+$-type semiconductor layer 7 in the stacking direction (d1>d2). It can also be said that the depth of the $p^+$-type semiconductor layer 7 in the stacking direction is shallower than the depth of the $p^+$-type semiconductor layer 5.

The depths of the $p^+$-type semiconductor layers 5 and 7 can be adjusted by changing the acceleration energy of ion implantation. When the acceleration energy of ion implantation is increased, the $p^+$-type semiconductor layer can be formed deeply.

The $p^+$-type semiconductor layers 5 and 7 are obtained, for example, by implanting impurities of boron (B) into silicon.

The $n^+$-type semiconductor layers 6 and 8 are obtained, for example, by implanting impurities of phosphorus (P), antimony (Sb), or arsenic (As) into silicon. In this embodiment, the $n^+$-type semiconductor layers 6 and 8 have substantially the same impurity concentration and the same thickness.

The electrode 10 and the backside electrode 9 apply voltages to the $p^+$-type semiconductor layers 5 and 7 and the $n^+$-type semiconductor layers 6 and 8 to drive the first light detection elements 1 and the second light detection elements and output the electric signals photoelectrically converted between the $p^+$-type semiconductor layers 5 and 7 and the $n^+$-type semiconductor layers 6 and 8 to the driving/reading unit (not illustrated). The material of the electrode 10 and the backside electrode 9 is, for example, aluminum or an aluminum-containing material, copper or a copper-containing material, gold or a gold-containing material, indium tin oxide (ITO), or another metallic material combined with the material.

The protective layer 70 is provided to protect the electrode 10 so as not to be short-circuited due to contact with the outside. The material of the protective layer 70 is, for example, a silicon oxide film, a nitride film, or a stacked film thereof.

Figure 2B:
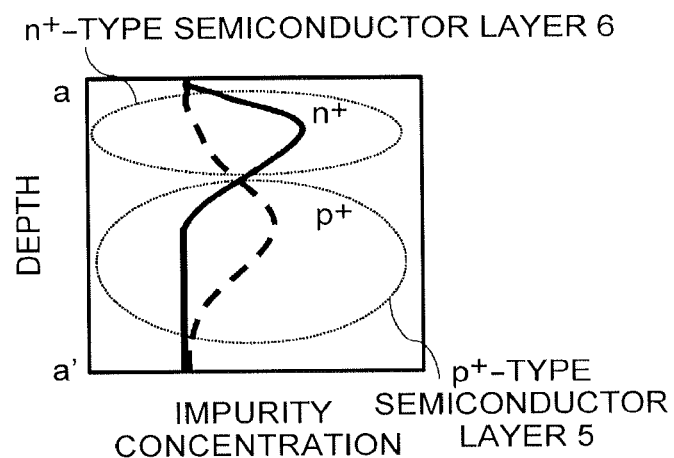
FIG. 2B is a diagram illustrating an impurity concentration distribution of a first light detection element.
Figure 2C:
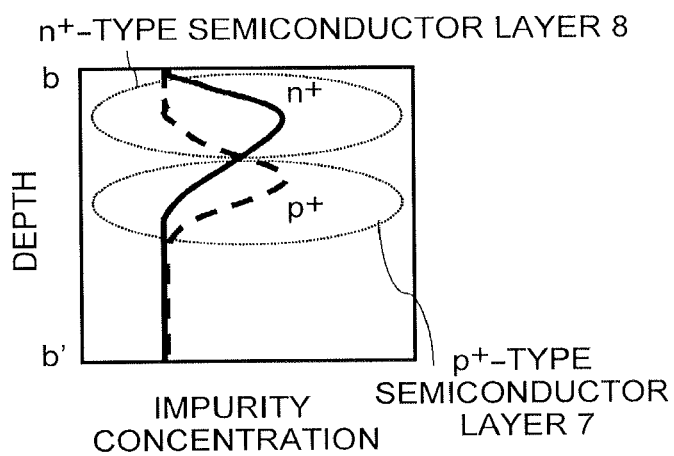
FIG. 2C is a diagram illustrating an impurity concentration distribution of a second light detection element.

FIG. 2B is a diagram illustrating an impurity concentration distribution in an a-a' cross section of the first light detection element 1. FIG. 2C is a diagram illustrating an impurity concentration distribution in a b-b' cross section of the second light detection element 2.

In FIG. 2B, the region where the impurity concentration is higher than the impurity concentration is the $p^+$-type semiconductor layer 5, and the region where the $n^+$ impurity concentration is higher than the impurity concentration is the $n^+$-type semiconductor layer 6. In addition, in FIG. 2C, the region where the impurity concentration is higher than the $n^+$ impurity concentration is the $p^+$-type semiconductor layer 7, and the region where the $n^+$ impurity concentration is higher than the impurity concentration is $n^+$-type semiconductor layer 8.

Since impurities are implanted with higher acceleration energy in FIG. 2B than in FIG. 2C, the impurities exist at the deeper position in FIG. 2B. As compared with the regions where the impurity concentration is higher than the $n^+$ impurity concentration, FIG. 2B has a larger region where the impurity concentration is higher than the impurity concentration. That is, the depth of the $p^+$-type semiconductor layer 7 is formed to be shallower than the depth of the $p^+$-type semiconductor layer 5. In addition, in FIGS. 2B and 2C, since impurities are implanted with substantially the same implantation energy, the impurities exist at substantially the same depth. Even as compared with the regions where the impurity concentration is higher than the impurity concentration, the regions have substantially the same size. That is, the depths of the $n^+$-type semiconductor layer 6 and the $n^+$-type semiconductor layer 8 are substantially the same depth.

Next, the light detection operation of the photodetector including the first light detection elements 1 and the second light detection elements 2 will be described.

In a detection standby state, the first light detection elements 1 and the second light detection elements 2 are applied with a reverse voltage higher than a breakdown reverse voltage between the electrode 10 and the backside electrode 9 so as to be driven in a region called a Geiger mode. Since the gain of the light detection element during driving in the Geiger mode is extremely high as 10 to the 5th power to 10 to the 6th power, such weak light as one photon can be measured. Discharge phenomenon that electric charges discharge in this Geiger mode is called Geiger discharge.

Resistors (not illustrated) are connected in series to each light detection element, and when one photon is incident and Geiger discharge occurs, an amplification effect by a pn junction terminates due to the voltage drop caused by the resistors, so that pulse-shaped charges are obtained between the electrode 10 and the backside electrode 9. These charges are taken out from the electrode 10.

In the photodetector which are connected in parallel with each light detection element, each light detection element performs this function. Therefore, when Geiger discharge occurs in a plurality of light detection elements, with respect to the charges of the one light detection element, a charge amount which is several times the number of the light detection elements that have Geiger-discharged or a charge of the pulse wave height value can be obtained. Therefore, the number of light detection elements that have Geiger-discharged from the charges, that is, the number of photons incident on the photodetector can be measured, so that it is possible to perform photon measurement photon by photon.

Figure 3:
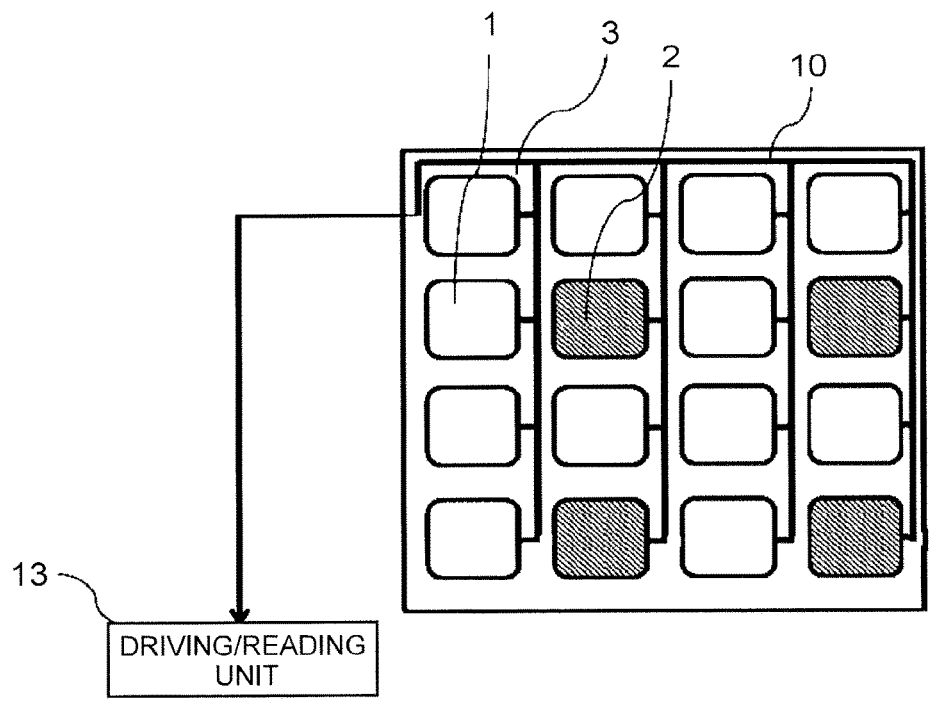
FIG. 3 is a drawing illustrating a lead-out wireline of the photodetector according to the first embodiment.

FIG. 3 is a diagram illustrating a lead-out wireline of the photodetector according to the first embodiment.

As illustrated in FIG. 3, the electrode 10 is provided for leading out electric signals photoelectrically converted by the first light detection elements 1 and the second light detection elements 2. In addition, the electrode 10 outputs the electric signals output from the first light detection elements 1 and the second light detection elements 2 together to the driving/reading unit 13.

Next, the operation of the photodetector according to the first embodiment will be described.

Figure 4:
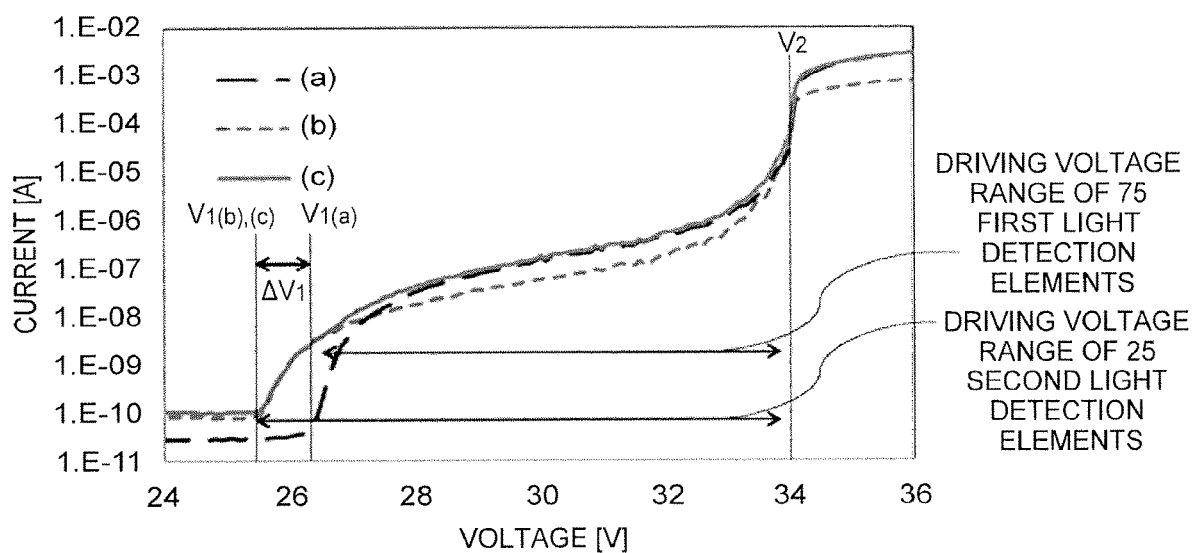
FIG. 4 is a diagram illustrating a relationship between voltages and currents flowing when the voltages are applied to the photodetector.

In FIG. 4, the horizontal axis represents a voltage applied between the electrode 10 and the backside electrode 9, and the vertical axis represents a current flowing through the photodetector.

(a) indicates a case where a voltage is applied between the electrode 10 of the 75 first light detection elements and the backside electrode 9, (b) indicates a case where a voltage is applied between the electrode 10 of the 25 second light detection elements and the backside electrode 9, and (c) indicates a case where a voltage is applied between the electrode 10 of the 75 first light detection elements and of the 25 second light detection elements and the backside electrode 9.

However, in (a), (b), and (c), the opening areas of the first light detection element 1 and the second light detection element 2 are substantially the same, and the distance between the elements is also substantially the same.

The voltage at which the current begins to rise is denoted by a voltage $V_1$ and the voltage at which the current further sharply rises is denoted by a voltage $V_2$. However, the voltage $V_1$ is the minimum voltage required for photoelectric conversion by the light detection element, and the voltage $V_2$ is the voltage at which the photoelectric conversion efficiency is the best. The range between the voltage $V_1$ and the voltage $V_2$ is a driving voltage range. In other words, Driving Voltage Range=Voltage $V_2$−Voltage $V_1$.

Figure 5:
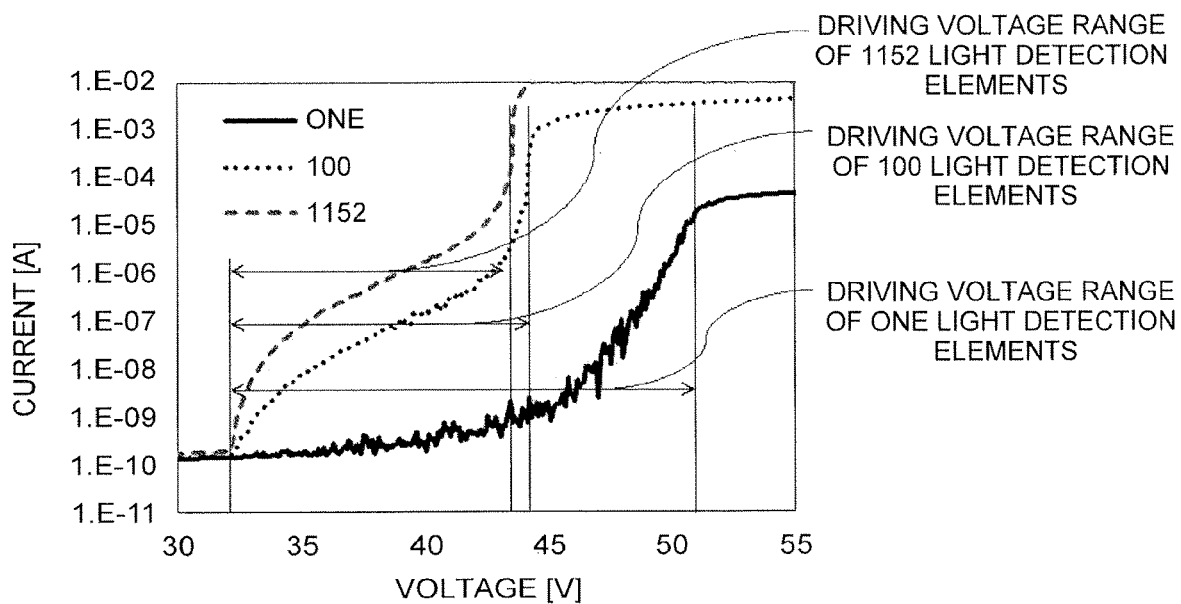
FIG. 5 is a diagram illustrating a relationship between the number of light detection elements and a driving voltage range.

In addition, as illustrated in FIG. 5, the driving voltage range tends to become narrow as the number of light detection elements increases.

Figure 6:
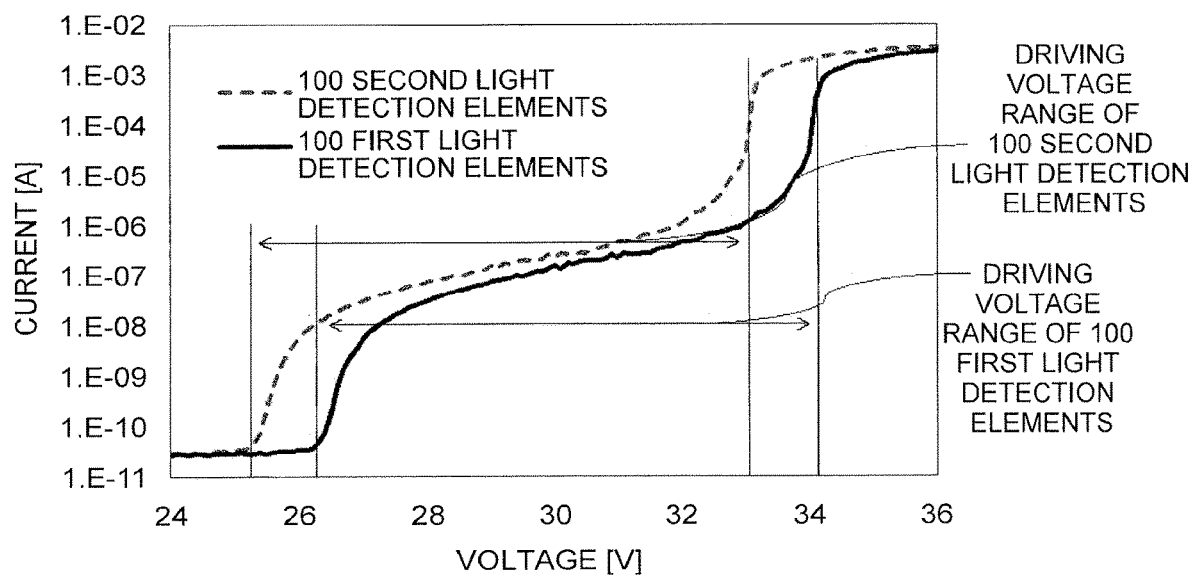
FIG. 6 is a diagram illustrating a relationship between a first light detection element and a second light detection element and a driving voltage range.

As illustrated in FIG. 6, the depth of the $p^+$-type semiconductor layer 7 of the second light detection element 2 is shallower than that of the $p^+$-type semiconductor layer 5 of the first light detection element 1. It can be said that there is a tendency that, as the depth of the $p^+$-type semiconductor layer becomes shallower, the voltage $V_1$ and the voltage $V_2$ decrease with the driving voltage range remaining substantially unchanged. In addition, it can be understood that the driving voltage range hardly changes even though the depth of the $p^+$-type semiconductor layer changes.

As illustrated in FIG. 4, in the photodetector of (a) including the 75 first light detection elements, the voltage $V_1$ is about 26 V, and the voltage $V_2$ is about 34 V. In the photodetector of (b) including the 25 second light detection elements, the voltage $V_1$ is about 25 V, and the voltage $V_2$ is about 34 V. In the photodetector of (c) including the 75 first light detection elements and the 25 second light detection elements according to this embodiment, the voltage $V_1$ is about 25 V, and the voltage $V_2$ is about 34 V. From the above experimental values, (b) and (c) are smaller by about 1 V than (a) in voltage $V_1$ (the range of the voltage between the voltage $V_1$ of (a) and the voltage $V_1$ of (b) and (c) is referred to as $\Delta V_1$). Therefore, it can be said that the photodetectors of (b) and (c) are wider in the driving voltage range.

Since the photodetector of (c) according to this embodiment includes the light detection elements 1 and 2 having different driving voltage ranges, if the applied voltage is within a range of $\Delta V_1$, the first light detection element 1 is not driven, but the second light detection element 2 is driven. In the range of $\Delta V_1$, since the first light detection element 1 is not driven, the first light detection element 1 serves as a spacer, and even though the second light detection element 2 is driven, the distance between the second light detection elements 2 is separated, so that it is possible to suppress occurrence of noise such as crosstalk.

In the photodetector of (b), since the adjacent light detection elements are identical, when a certain light detection element is driven, the light detection element interferes with the adjacent light detection element, so that noise such as crosstalk occurs.

Next, a case where both the light detection elements 1 and 2 are driven in the photodetector of (c) according to this embodiment will be described.

The difference between the voltage $V_1$ and an arbitrary applied voltage of $V_1$ or more is called an overvoltage. For example, in FIG. 4, when the overvoltage of the first light detection element 1 and the overvoltage of the second light detection element 2 are calculated in a case where the applied voltage is 28 V, the overvoltage of the first light detection element 1 becomes 2 V, and the overvoltage of the second light detection element 2 becomes 3 V. Therefore, the overvoltage of the first light detection element 1 is smaller. As illustrated in FIG. 4, as the overvoltage is larger, the current flowing through the photodetector easily flows. In a case where noise occurs due to interference between elements that are so adjacent that the current can easily flow, the noise is easily output, so that the crosstalk increases. For this reason, in a case where the first light detection elements 1 and the second light detection elements 2 are driven, since the number of the first light detection elements 1 having a small overvoltage is larger than the number of the second light detection elements 2 having a large overvoltage, the overvoltage becomes relatively small, and thus, the crosstalk also decreases.

From the above description, the photodetector of (c) has a wide driving voltage range and can suppress noise such as crosstalk.

It is preferable that the ratio of the number of the first light detection elements 1 and the number of the second light detection elements 2 is 3 or more and 24 or less. In a case where the ratio of the number is less than 3, the proportion of the second light detection elements 2 becomes large, and there is a possibility that noise such as crosstalk occurs due to interference between the second light detection elements 2. In a case where the ratio of the number is larger than 24, since the number of the second light detection elements 2 is small, the detection error increases. Therefore, when the number ratio is 3 or more and 24 or less, the interference between the second light detection elements 2 is small, and the detection error is also small.

Next, a manufacturing method will be described.

Figure 7:
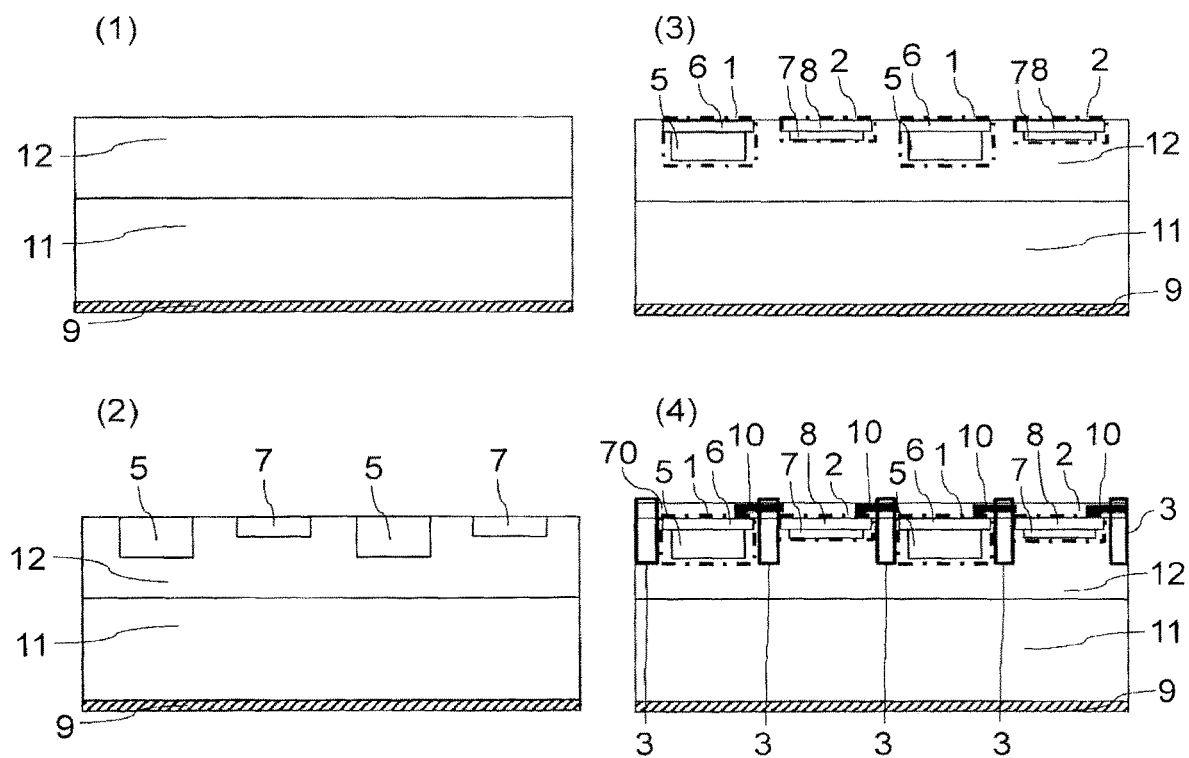
FIG. 7 is a diagram illustrating a method of manufacturing the photodetector according to the first embodiment.

FIG. 7 is a diagram illustrating a method of manufacturing the photodetector according to the first embodiment. First, as illustrated in FIG. 7A, the backside electrode 9 is formed on the backside of the high-concentration p-type substrate 11 by chemical vapor deposition (CVD), and the p-type semiconductor layer 12 is formed by epitaxially growing lightly doped p-type silicon on the light incident side.

As illustrated in FIG. 7B, by implanting boron ions at predetermined positions of the p-type semiconductor layer 12 with predetermined energy, the p$^+$-type semiconductor layers are formed to be deep in the stacking direction. Subsequently, by implanting boron ions at positions other than the above-mentioned predetermined positions with energy lower than the above-mentioned predetermined energy, the p$^+$-type semiconductor layers 7 are formed to be shallower than the p$^+$-type semiconductor layers 5 in the stacking direction. In FIG. 7C, in consideration of the ratio of the number of the first light detection elements 1 and the number of the second light detection elements 2 being 3 or more and 24 or less, ion implantation for the p$^+$-type semiconductor layers 5 and the p$^+$-type semiconductor layers 7 are performed. In consideration of the ratio between the number of the first light detection elements 1 and the number of the second light detection elements 2, the second light detection elements 2 are formed so that the distance between the second light detection elements 2 is increased.

As illustrated in FIG. 7C, by implanting phosphorus ions into the p$^+$-type semiconductor layers 5 and 7, the n$^+$-type semiconductor layers 6 and 8 are formed. Through this process, the first light detection elements 1 and the second light detection elements 2 are formed.

Since the ion implantation energies of the p$^+$-type semiconductor layers 5 and 7 are different, the depths in the stacking direction are different, but since the ion implantation energies of the n$^+$-type semiconductor layers 6 and 8 are substantially the same, the depths are substantially the same.

As illustrated in FIG. 7D, after forming a mask (not illustrated) having a predetermined shape above the p-type semiconductor layer 12, the first light detection element 1, and the second light detection element 2, the electrode 10 is formed so as to be electrically connected to the n$^+$-type semiconductor layers 6 and 8 by CVD. After that, the mask is removed. In addition, a protective layer 70 is formed by CVD so as to cover the p-type semiconductor layer 12, the first light detection element 1, the second light detection element 2, and the electrode 10.

Through the above-described processes, the photodetector according to this embodiment can be easily manufactured.

By changing the ion implantation condition of the p$^+$-type semiconductor layer of the light detection element, the photodetector according to the first embodiment has a wide driving voltage range and suppresses noise, so that it is possible to easily manufacture the photodetector.

Regardless of the example in FIG. 2A, the p$^+$-type semiconductor layers 5 and 7 may have different impurity concentrations.

Regardless of the example in FIG. 2A, the p type and n type may be reversed.

Second Embodiment

Figure 8:
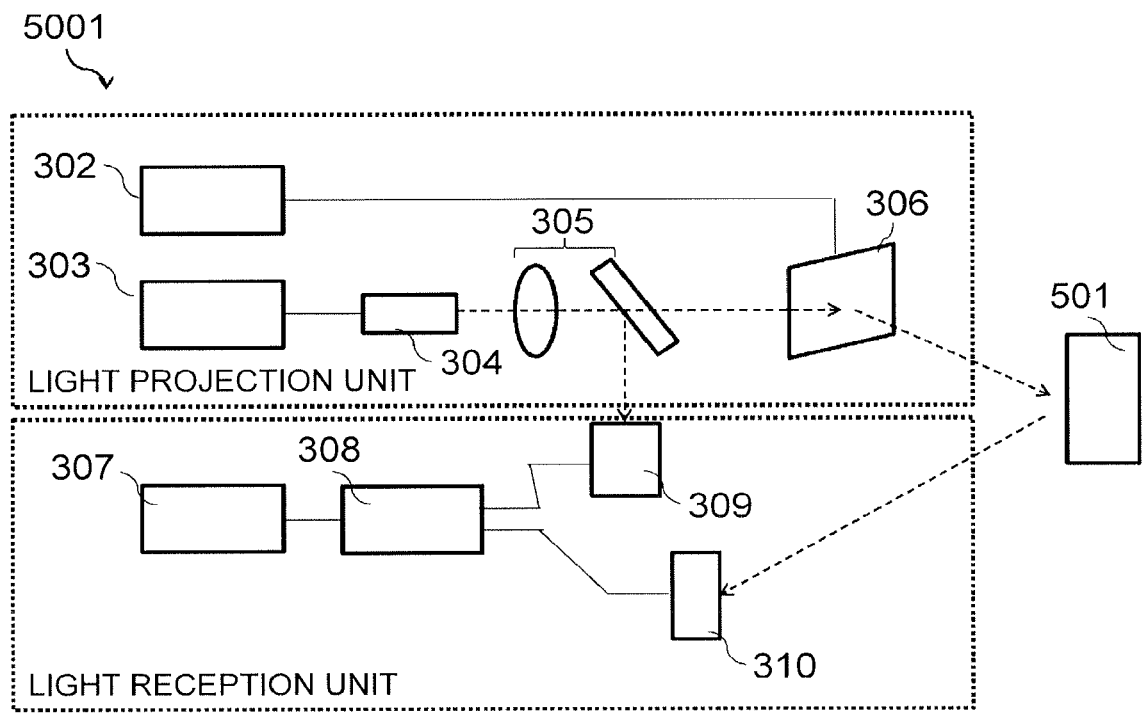
FIG. 8 is a diagram illustrating a LIDAR device according to a second embodiment.

FIG. 8 is a diagram illustrating a LIDAR device 5001 according to a second embodiment.

The LIDAR device 5001 according to this embodiment can be applied to long distance subject detection system configured with a line light source and a lens and the like. The LIDAR device 5001 includes a light projection unit that projects laser light to a target 501, a light reception unit that receives laser light from the target 501, and a time-of-flight (TOF) distance measurement device (not illustrated) that measures a time when the laser light reciprocates to the target 501 and converts the time into a distance.

In the light projection unit, a laser light oscillator 304 oscillates laser light. A driving circuit 303 drives the laser light oscillator 304. The optical system 305 extracts a portion of the laser light as reference light and irradiates the target 501 with the other laser light through a mirror 306. A mirror controller 302 controls the mirror 306 to project laser light onto the target 501. Herein, the light projection denotes hitting with light.

In the light reception unit, a reference light photodetector 309 detects the reference light extracted by an optical system 305. A photodetector 310 receives reflected light from the target 501. A distance measurement circuit 308 measures the distance to the target 501 on the basis of a difference between the time when the reference light photodetector 309 detects the reference light and the time when the photodetector 310 detects the reflected light. An image recognition system 307 recognizes the target 501 based on the result measured by the distance measurement circuit 308.

The LIDAR device 5001 is a distance image sensing system adopting a time-of-flight (TOF) distance measuring method of measuring a time when the laser light reciprocates to the target 501 and converting the time into a distance. The LIDAR device 5001 is applied to an in-vehicle drive-assist system, remote sensing, and the like. When the photodetector according to the first embodiment is used as the photodetector 310, the photodetector exhibits good sensitivity particularly in a near infrared range. For this reason, the LIDAR device 5001 can be applied to a light source in a wavelength band which is invisible to persons. The LIDAR device 5001 can be used, for example, for obstacle detection for a vehicle.

Figure 9:
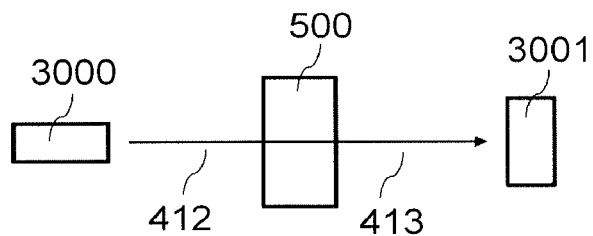
FIG. 9 is a diagram illustrating a measurement system of the LIDAR device of FIG. 8.

FIG. 9 is a diagram illustrating a measurement system.

The measurement system includes at least a photodetector 3001 and a light source 3000. The light source 3000 of the measurement system emits light 412 to an object 500 to be measured. The photodetector 3001 detects the light 413 transmitted through, reflected on, or diffused by the object 500.

With respect to the photodetector 3001, a highly sensitive measurement system is realized by using, for example, the photodetector according to the first embodiment.

While several embodiments of the invention have been described, these embodiments have been presented as examples, but these embodiments are not intended to limit the scope of the invention. These embodiments can be implemented in various other forms, and various omissions, substitutions, and changes can be made without departing from the spirit of the invention. When these embodiments are included in the scope and spirit of the description, these embodiments and modifications are included in the scope of the invention disclosed in the claims and equivalents thereof.

What is claimed is:

1. A photodetector comprising:
a plurality of first light detection elements having a first driving voltage range, the first light detection elements including first semiconductor layers having a first conductivity type and second semiconductor layers having a second conductivity type different from the first conductivity type; and at least one or more second light detection elements having a second driving voltage range different from the first driving voltage range, each second light detection element including a third semiconductor layer having the first conductivity type and a fourth semiconductor layer having the second conductivity type, wherein a number of the first light detection elements is larger than a number of the second light detection elements, and wherein a first minimum voltage of the first driving voltage range required for photoelectric conversion by the first light detection elements is larger than a second minimum voltage of the second driving voltage range required for photoelectric conversion by the second light detection elements.

2. A photodetector of claim 1,
wherein each of the second light detection elements is provided between the first light detection elements.

3. A photodetector of claim 1, further comprising:
an electrode electrically connected to the first light detection elements and the second light detection elements.

4. A photodetector of claim 1,
wherein a first interface between the first semiconductor layer and the second semiconductor layer, and a second interface between the third semiconductor layer and fourth semiconductor layer form a pn junction.

5. A photodetector of claim 1,
wherein the driving voltage range of each of the first light detection elements is narrower than the driving voltage range of each of the second light detection elements.

6. A photodetector of claim 1,
wherein the ratio of the number of the first light detection elements and the number of the second light detection elements is 3 or more and 24 or less.

7. A LIDAR apparatus comprising:
a light source emitting light to an object; and
a photodetector including a plurality of first light detection elements having a first driving voltage range, the first light detection elements including first semiconductor layers having a first conductivity type and second semiconductor layers having a second conductivity type different from the first conductivity type and at least one or more second light detection elements having a second driving voltage range different from the first driving voltage range, each second light detection element including a third semiconductor layer having the first conductivity type and a fourth semiconductor layer having the second conductivity type detecting incident light reflected by the object, wherein a number of the first light detection elements is larger than a number of the second light detection elements, and wherein a first minimum voltage of the first driving voltage range required for photoelectric conversion by the first light detection elements is larger than a second minimum voltage of the second driving voltage range required for photoelectric conversion by the second light detection elements.

* * * * *